US008993357B2

(12) United States Patent
Kishimoto et al.

(10) Patent No.: US 8,993,357 B2
(45) Date of Patent: Mar. 31, 2015

(54) METHOD FOR MANUFACTURING LIQUID DISCHARGE HEAD

(71) Applicant: Canon Kabushiki Kaisha, Tokyo (JP)

(72) Inventors: Keisuke Kishimoto, Yokohama (JP); Taichi Yonemoto, Isehara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/198,356

(22) Filed: Mar. 5, 2014

(65) Prior Publication Data

US 2014/0256069 A1 Sep. 11, 2014

(30) Foreign Application Priority Data

Mar. 6, 2013 (JP) ................................. 2013-044068

(51) Int. Cl.

*H01L 21/00* (2006.01)
*H01L 21/302* (2006.01)
*H01L 21/461* (2006.01)
*B41J 2/16* (2006.01)

(52) U.S. Cl.

CPC .............. *B41J 2/1628* (2013.01); *B41J 2/1603* (2013.01); *B41J 2/1607* (2013.01); *B41J 2/1629* (2013.01); *B41J 2/1634* (2013.01); *B41J 2/1639* (2013.01)

USPC ....... 438/21; 438/704; 438/723; 257/E21.223

(58) Field of Classification Search

CPC ...................................................... B41J 2/1628
USPC ..................... 438/21, 704, 723; 257/E21.223
See application file for complete search history.

(56) References Cited

U.S. PATENT DOCUMENTS

| | | | | |
|---|---|---|---|---|
| 2010/0323526 | A1* | 12/2010 | Kishimoto et al. | 438/753 |
| 2013/0088548 | A1* | 4/2013 | Saito et al. | 347/68 |
| 2013/0229464 | A1* | 9/2013 | Nawano | 347/68 |
| 2013/0278679 | A1* | 10/2013 | Takeuchi et al. | 347/47 |

FOREIGN PATENT DOCUMENTS

| | | |
|---|---|---|
| JP | 2004-148825 A | 5/2004 |

* cited by examiner

*Primary Examiner* — David S Blum

(74) *Attorney, Agent, or Firm* — Canon USA Inc. IP Division

(57) ABSTRACT

A method for manufacturing a liquid discharge includes a process of forming a plurality of blind holes extending from a first surface of the silicon substrate toward a second surface which is a surface opposite to the first surface in the silicon substrate and a process of subjecting the silicon substrate in which the plurality of blind holes are formed to anisotropic etching from the first surface to form a liquid supply port in the silicon substrate, in which, in the process of forming the liquid supply port, the silicon in a region sandwiched by the plurality of blind holes when the silicon substrate is seen from the second surface side is left without being removed by the anisotropic etching to use the left silicon as a beam.

11 Claims, 5 Drawing Sheets

METHOD FOR MANUFACTURING LIQUID DISCHARGE HEAD

BACKGROUND OF THE INVENTION

1. Field of the Invention

The present invention relates to a method for manufacturing a liquid discharge head.

2. Description of the Related Art

A liquid discharge apparatus, such as an ink jet recording apparatus, discharges liquid from a liquid discharge head to apply the liquid onto a recording medium to thereby form an image on the recording medium. The liquid discharge head of the liquid discharge apparatus has a substrate and a discharge port formation member (nozzle layer) which is formed on the front surface side of the substrate and in which the discharge ports are formed. In general, a silicon substrate formed of silicon is used as the substrate. On the other hand, the nozzle layer is formed of resin, metal, and the like.

On the front surface side of the substrate, energy generating elements which generate energy for discharging the liquid are formed. Moreover, the substrate is provided with a liquid supply port which penetrates through the substrate and supplies the liquid to the energy generating elements. The liquid supplied from the liquid supply port passes through a flow path formed by the nozzle layer, the energy is given to the liquid by the energy generating elements, and then the liquid is discharged from the discharge ports.

The substrate is a member supporting the nozzle layer and is required to have high strength. Then, Japanese Patent Laid-Open No. 2004-148825 describes a method for forming a beam in the liquid supply port in order to increase the strength of the substrate in which the liquid supply port is formed. Specifically, the method includes first forming a mask on the back surface of the substrate, processing the substrate by a laser or dry etching, and then performing etching from both surfaces of the substrate. Since the mask is formed on the back surface side of the substrate, the silicon substrate remains on the back surface side of the substrate, and the remaining silicon substrate serves as a beam.

SUMMARY OF THE INVENTION

The present invention relates to a method for manufacturing a liquid discharge head having a silicon substrate in which a beam is formed in a liquid supply port and the method includes a process of forming a first liquid supply port in a silicon substrate, a process of forming a plurality of blind holes extending from a first surface of the silicon substrate toward a second surface which is a surface opposite to the first surface in the silicon substrate from the bottom surface of the first liquid supply port, and a process of subjecting the silicon substrate in which the plurality of blind holes are formed to anisotropic etching from the first surface to form a second liquid supply port in the silicon substrate, in which the first liquid supply port and the second liquid supply port constitute at least one part of the liquid supply port, and, in the process of forming the second liquid supply port in the silicon substrate, the silicon in a region sandwiched by the plurality of blind holes when the silicon substrate is seen from the second surface side is left without being removed by the anisotropic etching in order to use the silicon left in the region sandwiched by the plurality of blind holes as a beam.

Further features of the present invention will become apparent from the following description of exemplary embodiments with reference to the attached drawings.

DESCRIPTION OF THE EMBODIMENTS

In the case of forming a beam in a liquid supply port, it is suitable to form the beam in a region on the front surface side of a substrate of the liquid supply port because the strength of the substrate is improved.

However, on the front surface side of the substrate, i.e., the side on which energy generating elements are formed, various members, such as a nozzle layer, are formed. Therefore, it is not easy to form the beam in the region on the front surface side of the substrate of the liquid supply port by the method in which etching is performed from both surfaces of the substrate described in Japanese Patent Laid-Open No. 2004-148825. After forming the beam in the liquid supply port, the nozzle layer can be formed. However, in this case, a problem that the previously formed nozzle layer falls into the liquid supply port occurs in some cases.

Therefore, it is an object of the present invention to easily form the beam in the region on the front surface side of the substrate of the liquid supply port by performing processing from the back surface side of the substrate.

The above-described problem is solved by the present invention described below. More specifically, the present invention is a method for manufacturing a liquid discharge head having a silicon substrate in which a beam is formed in a liquid supply port and the method includes a process of forming a first liquid supply port in a silicon substrate, a process of forming a plurality of blind holes extending from a first surface of the silicon substrate toward a second surface which is a surface opposite to the first surface in the silicon substrate from the bottom surface of the first liquid supply port, and a process of subjecting the silicon substrate in which the plurality of blind holes are formed to anisotropic etching from the first surface to form a second liquid supply port in the silicon substrate, in which the first liquid supply port and the second liquid supply port constitute at least one part of the liquid supply port, and, in the process of forming the second liquid supply port in the silicon substrate, the silicon in a region sandwiched by the plurality of blind holes when the silicon substrate is seen from the second surface side is left without being removed by the anisotropic etching in order to use the silicon left in the region sandwiched by the plurality of blind holes as a beam.

Figure 1:
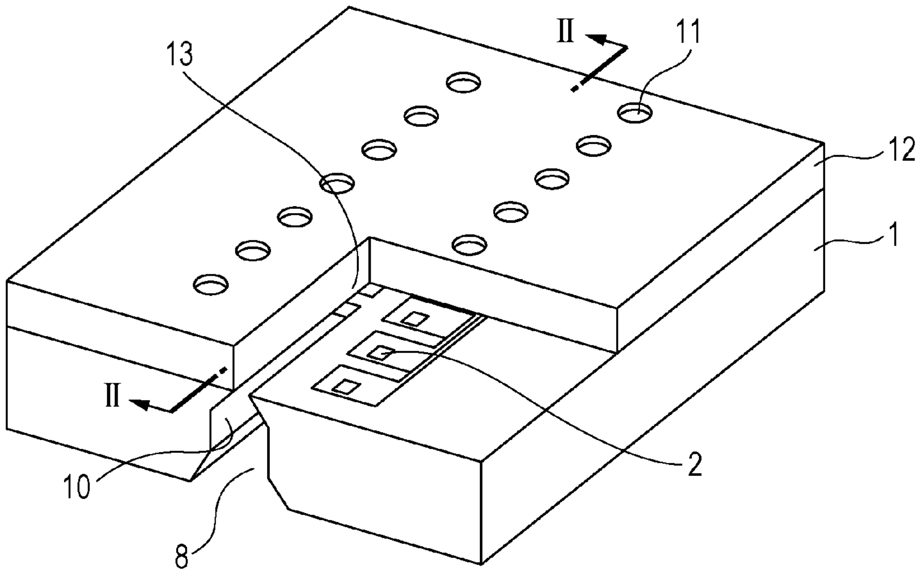
FIG. 1 is a view illustrating an example of a liquid discharge head manufactured in the present invention.

FIG. 1 illustrates an example of the liquid discharge head manufactured in the present invention. The liquid discharge head has a silicon substrate 1 formed of silicon. The silicon substrate 1 has a first surface (back surface) and a second surface (front surface) which is a surface opposite to the first surface. When manufacturing the liquid discharge head, it is suitable that, at the first surface and the second surface, the orientation of crystal plane of the silicon is (100). More specifically, the silicon substrate is suitably a (100) substrate.

On the second surface side of the silicon substrate, energy generating elements 2 which generate energy for discharging liquid are formed. Examples of the energy generating elements include a heat element, such as TaSiN, and a piezoelectric element. The energy generating elements may be in contact with the silicon substrate or may be formed in a partially hollow shape such that there is a space between the energy generating elements and the silicon substrate. Moreover, a discharge port formation member (nozzle layer) 12 is formed on the second surface side of the silicon substrate. In the discharge port formation member, a flow path and discharge ports 11 through which liquid passes are formed.

In the silicon substrate, a liquid supply port is formed. In FIG. 1, a first liquid supply port 8 located on the first surface side and a second liquid supply port 10 located on the second surface side of the silicon substrate relative to the first supply port are formed, and the first liquid supply port and the second liquid supply port constitute one liquid supply port.

In the liquid supply port, a beam 13 is formed on the second surface side of the silicon substrate. The beam is formed of a part of the silicon substrate, i.e., silicon. By forming the beam on the second surface side of the silicon substrate of the liquid supply port, the strength of the silicon substrate in which the liquid supply port is formed can be increased.

The method for manufacturing a liquid discharge head of the present invention is described with reference to FIG. 2 to FIG. 4. FIGS. 2A to 2D are cross sectional views taken along the line II-II illustrated in FIG. 1. FIGS. 3A to 3D and FIGS. 4A to 4E are cross sectional views of the same part of the silicon substrate.

The method for manufacturing a liquid discharge head illustrated in FIG. 2 is described. First, as illustrated in FIG. 2A, the silicon substrate 1 is prepared. On both surfaces of the silicon substrate, oxide films 1*a* are formed. Examples of materials of the oxide films 1*a* include $SiO_2$. For example, in order to remove the oxide films to expose the silicon, in the case where the oxide films contain $SiO_2$, the oxide films can be removed using buffered fluoric acid and the like.

On the first surface (upper surface in FIG. 1) of the silicon substrate, an etching mask 4 is formed. The etching mask 4 has resistance against the etching to be performed later, and can be formed of polyamide or polyimide. In the etching mask 4, an opening portion 5 is formed. The opening portion 5 is formed by removing a part of the etching mask by dry etching, for example.

On the side of a second surface (lower surface in FIG. 1) of the silicon substrate, a sacrificial layer 6 is formed. The sacrificial layer is more easily etched by the anisotropic etching to be performed later than the silicon substrate. By forming the sacrificial layer, the opening width on the second surface side of the liquid supply port can be more favorably controlled. The sacrificial layer can be formed of, for example, an Al—Si alloy, Al—Cu, Cu, and the like and is covered with the above-described oxide film.

The oxide film is covered with a passivation layer 3. Examples of materials of the passivation layer 3 include $SiO_2$ and SiN.

In the silicon substrate, concave portions 14 are formed at positions corresponding to the opening portion 5. The concave portions 14 extend from the first surface toward the second surface side of the silicon substrate. The concave portions 14 are formed by irradiation of a laser, for example. As the laser, third harmonic generation light (THG: wavelength of 355 nm) of a YAG laser is used, for example. The wavelength of the laser may be a wavelength at which the silicon which is the material forming the silicon substrate 1 can be processed. For example, second harmonic generation light (SHG: wavelength of 532 nm) of a YAG laser has a relatively high absorption rate for silicon similarly to the THG and can be used. The concave portions 14 may be formed by ablation using a laser or, as another method, may be formed by reactive ion etching, for example. The diameter of the concave portions (diameter as viewed from the first surface side, equivalent circle diameter in the case of a shape other than a circle) is suitably set to 5 μm or more and 100 μm or less. By setting the diameter to 5 μm or more, an etching solution easily enters the concave portions 14 in the anisotropic etching to be performed in the following process. Moreover, by setting the diameter to 100 μm or less, overlapping of the concave portions 14 with each other can be suppressed in the formation of the concave portions 14.

Figure 2A:
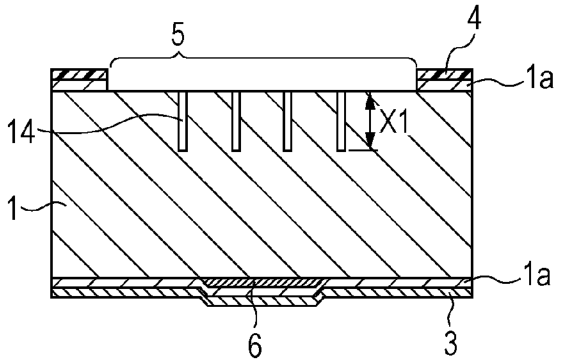
FIGS. 2A to 2D are views illustrating an example of a method for manufacturing a liquid discharge head of the present invention.

When the thickness of the silicon substrate in FIG. 2A is set to 725 μm, the depth (X1) from the first surface of the concave portion 14 is suitably set to 100 μm or more and 400 μm or less. More specifically, the distance from the end (end on the second surface side of the concave portion 14) of the concave portion 14 to the second surface of the silicon substrate is suitably set to 325 μm or more and 625 μm or less. When specifying the thickness and the length in the present invention, the shortest distance is referred to.

Figure 2B:
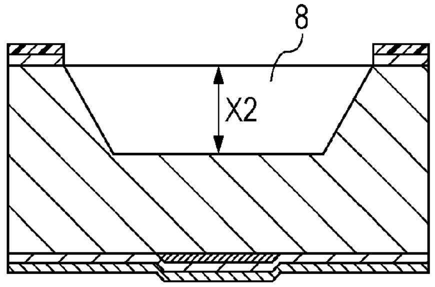

Next, as illustrated in FIG. 2B, anisotropic etching is performed from the first surface of the silicon substrate 1 to form a first liquid supply port 8. Examples of the etching solution for use in the anisotropic etching include a strong alkaline solution, such as TMAH (tetramethyl ammonium hydroxide) and KOH (potassium hydroxide). In the anisotropic etching, the etching mask 4 serves as a mask, and the etching proceeds from the opening portion 5.

When the thickness of the silicon substrate in FIG. 2A is set to 725 μm, the depth (X2) from the first surface of the first liquid supply port is suitably 300 μm or more and 550 μm or less. More specifically, the distance from the bottom surface of the first liquid supply port to the second surface of the silicon substrate is suitably set to 175 μm or more and 425 μm or less. By setting the distance to 175 μm or more, the size of the beam to be formed in the liquid supply port can be secured, and the substrate strength can be increased. Moreover, by setting the distance to 425 μm or less, the depth of the blind holes for forming the second liquid supply port later can be made shallow, and a variation in the depth of the blind holes to be formed can be suppressed.

Figure 2C:
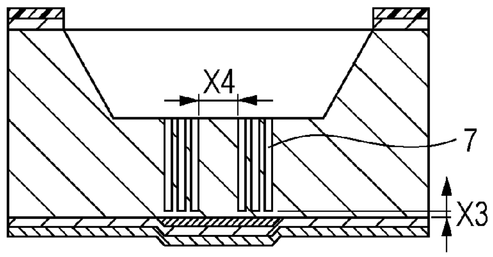

Next, as illustrated in FIG. 2C, a plurality of blind holes 7 extending from the first surface of the silicon substrate toward the second surface which is a surface opposite to the first surface are formed in the silicon substrate. Herein, since the first liquid supply port is formed, a plurality of blind holes extending toward the second surface side are formed from the first surface, i.e., the bottom surface of the liquid supply port. The blind holes 7 are formed in a region where the liquid supply port is to be finally formed. For example, when the silicon substrate is seen from the first surface side, the blind holes 7 are formed in such a manner as to be disposed in the region where the liquid supply port is to be formed. It is suitable that the plurality of blind holes are disposed in the shape of a line, so that a plurality of line of the blind holes are formed. In this case, when the silicon substrate is seen from the first surface side, it is suitable that the plurality of blind hole lines are substantially symmetrically disposed with respect to the center line along the longitudinal direction of the silicon substrate in the region where the liquid supply port is to be formed. By substantially symmetrically disposing the blind holes, the shape of the liquid supply port and the shape of the beam become good. FIGS. 2A to 2D illustrate cross sectional views in the lateral direction of the silicon substrate. More specifically, the longitudinal direction of the silicon substrate is a direction extending perpendicular to the lateral direction and along the discharge port line.

The blind holes 7 do not penetrate through the silicon substrate. Therefore, openings of the blind holes are formed on the first surface side but the openings are not formed on the second surface side. The length (X3) from the end (end on the second surface side of the blind holes 7) of the blind holes 7 to the second surface of the silicon substrate is suitably set to 10 μm and 75 μm or less. When the end of the blind holes is brought close to the second surface, the liquid supply port can be quickly formed. However, by setting X3 to 10 μm or more, the influence of the blind hole formation on the second surface side can be suppressed. For example, when the blind holes are formed by using a laser, and a discharge port formation member is formed on the second surface side, the influence of the heat on the discharge port formation member due to the use of the laser can be suppressed. Moreover, by setting X3 to 75 μm or less, the time until the liquid supply port is made to penetrate through the silicon substrate by the following anisotropic etching can be shortened, the size of the beam to be formed in the liquid supply port can be secured, and the substrate strength can be increased.

The blind holes 7 themselves finally serve as a part of the liquid supply port. The silicon in the region sandwiched by the plurality of blind holes when the silicon substrate is seen from the second surface side is partially removed by the anisotropic etching and also serves as a part of the liquid supply port. However, another part of the silicon in the region sandwiched by the plurality of blind holes when the silicon substrate is seen from the second surface side is left without being removed by the anisotropic etching. This part can be used as the beam in the liquid supply port. The region sandwiched by the plurality of blind holes when the silicon substrate is seen from the second surface side includes a region sandwiched by the blind holes and also includes a region which is not sandwiched by the blind holes in the cross sectional views of the silicon substrate as illustrated in FIGS. 2A to 2D. More specifically, a region on the side closer to the first surface rather than the region sandwiched by the blind holes in the cross sectional views of the silicon substrate as illustrated in FIGS. 2A to 2D is also included.

In the region where the silicon in the region sandwiched by the plurality of blind holes when the silicon substrate is seen from the second surface side is removed by the anisotropic etching, and then the region from which the silicon has been removed is used as the liquid supply port, the interval of the plurality of blind holes is suitably set to 25 μm or more and 100 μm or less. By setting the interval to 25 μm or more, overlapping of the blind holes with each other can be suppressed when the blind holes are formed. Moreover, by setting the interval to 100 μm or less, the time taken by the following anisotropic etching can be shortened, the size of the beam to be formed in the liquid supply port can be secured, and the substrate strength can be increased.

On the other hand, in the region where the silicon in the region sandwiched by the plurality of blind holes when the silicon substrate is seen from the second surface side is not removed by the anisotropic etching, and the silicon which is left is used as the beam in the liquid supply port, the interval of the plurality of blind holes is suitably set to 120 μm or more and 1000 μm or less. The interval of the blind holes in the region to be used as the beam in the liquid supply port is indicated by X4 in FIG. 2C. By setting the X4 to 120 μm or more, the time taken by the following anisotropic etching can be shortened. Furthermore, removal of the portion to serve as the beam by the anisotropic etching can be suppressed, the size of the beam to be formed in the liquid supply port can be secured, and the substrate strength can be increased. Moreover, by setting X4 to 1000 μm or less, the liquid discharge properties of the liquid discharge head can be increased. The interval of the plurality of blind holes refers to the shortest distance between the closest two blind holes.

Figure 2D:
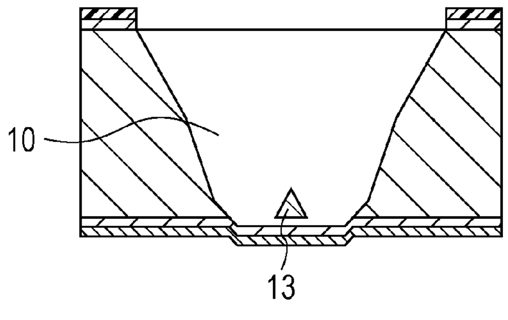

Next, as illustrated in FIG. 2D, the silicon substrate in which the plurality of blind holes are formed is subjected to anisotropic etching from the first surface to form a second liquid supply port 10 in the silicon substrate. One liquid supply port is formed in the silicon substrate by the first liquid supply port 8 and the second liquid supply port 10. Examples of an etching solution for use in the anisotropic etching include a strong alkaline solution, such as TMAH (tetramethyl ammonium hydroxide) or KOH (potassium hydroxide).

In the present invention, in the process of forming the liquid supply port in the silicon substrate, the silicon in the region sandwiched by the plurality of blind holes when the silicon substrate is seen from the second surface side is left without being removed by the anisotropic etching, and the silicon which is left is used as the beam 13.

In the present invention, as described above, the beam can be easily formed in the region on the front surface (the second surface) side of the silicon substrate in the liquid supply port by the processing from the back surface (the first surface) of the silicon substrate. Moreover, in the present invention, in the stage of FIG. 2A, even when the discharge port formation member is formed on the second surface side of the silicon substrate, the beam can be easily formed in the region on the front surface (the second surface) side of the silicon substrate in the liquid supply port.

Figure 3A:
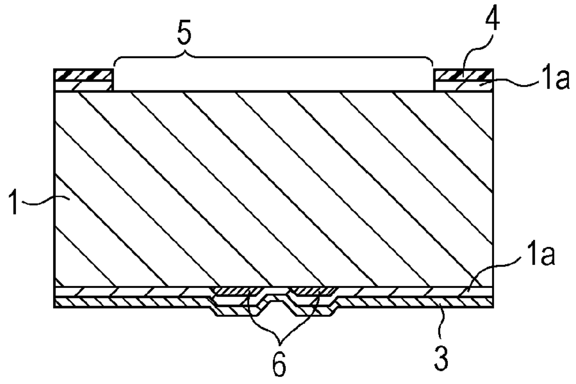
FIGS. 3A to 3D are views illustrating an example of the method for manufacturing a liquid discharge head of the present invention.
Figure 3B:
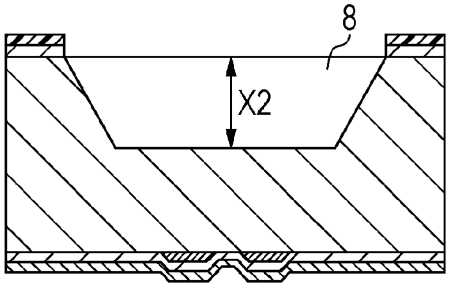
Figure 3C:
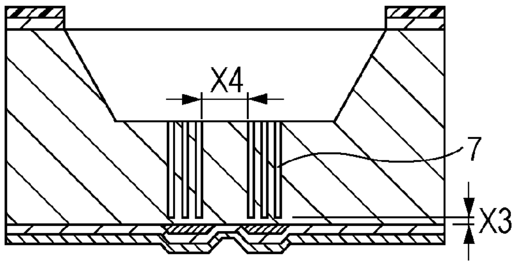
Figure 3D:
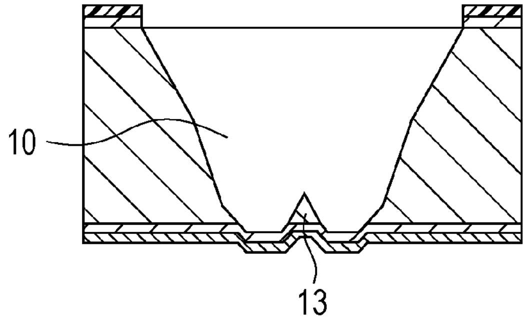

In the present invention, it is also suitable to not form the sacrificial layer 6 on part of the second surface side. This example is illustrated in FIG. 3A. When the sacrificial layer is present, the etching proceeds also from the sacrificial layer side, so that the silicon is removed. Therefore, by not forming the sacrificial layer at a position corresponding to the portion where the silicon is left to form the beam, the silicon can be sufficiently left, and then the beam can be formed. Moreover, the beam can be formed at a position in contact with the oxide film 1*a* of the silicon substrate. For example, when the silicon substrate is seen from the second surface side, it is suitable to not form the sacrificial layer at a position which overlaps with the center line along the longitudinal direction of the silicon substrate in the region where the liquid supply port is to be formed. Thus, the beam can be favorably formed at the center of the liquid supply port.

In FIG. 3A, the concave portion 14 is not formed. In FIGS. 3A to 3D, a liquid discharge head is manufactured by a method illustrated in FIGS. 3B to 3D in the same manner as in the description with reference to FIG. 2 except for these respects.

In the present invention, it is also suitable to form modified silicon regions on the second surface side of the silicon substrate. Thus, the beam can be formed at a position favorably separated from the second surface of the silicon substrate. With such a configuration, liquid is more favorably supplied. Moreover, a discharge port formation member, a mold material serving as a mold of a flow path, and the like can be favorably disposed on the second surface side of the silicon substrate. This modification means amorphization of silicon. An example in which modified regions 15 are formed on the second surface side of the silicon substrate is illustrated with reference to FIGS. 4A to 4E.

Figure 4A:
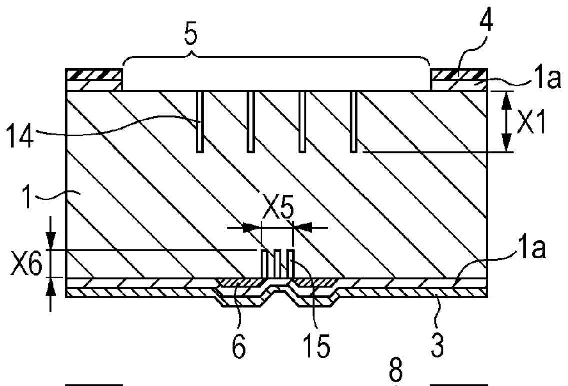
FIGS. 4A to 4E are views illustrating an example of the method for manufacturing a liquid discharge head of the present invention.

First, as illustrated in FIG. 4A, a silicon substrate 1 is prepared. FIG. 4A is basically the same as FIG. 2A but the modified silicon regions 15 are formed on the second surface side of the silicon substrate in FIG. 4A. When the sacrificial layer 6 is formed on the second surface side, it is suitable that the sacrificial layer and the modified regions do not overlap with each other when the silicon substrate is seen from the second surface side. Examples of a method for forming the modified regions include a method including adjusting the laser focus into the silicon substrate, and then performing multiphoton absorption laser processing. Examples of the laser include the fundamental wave (wavelength of 1060 nm) of a YAG laser. In addition thereto, a laser capable of causing multiphoton absorption in silicon may be acceptable, and a femtosecond laser can also be used. It is suitable that a plurality of lines of the modified regions are formed along the longitudinal direction of the silicon substrate.

With respect to the modified regions, the width (X5) of the direction along the lateral direction of the silicon substrate is suitably set to 120 μm and 1000 μm or less. Herein, the width refers to the interval of the two most greatly separated modified regions in the lateral direction of the silicon substrate as illustrated in FIG. 4A. By setting X5 to 120 μm or less, the beam can be favorably formed at a position separated from the second surface. Moreover, by setting X5 to 1000 μm or less, the liquid discharge properties of the liquid discharge head can be increased. The depth (X6) from the second surface of the modified region is suitably set to 2 μm or more and 120 μm or less. By setting X6 to 2 μm or more, the beam can be favorable formed at a position separated from the second surface. Moreover, by setting X6 to 120 μm or less, the removal of the beam by the anisotropic etching in FIG. 4D can be suppressed. The width and the depth of the modified regions can be measured by measurement with near-infrared light and a laser displacement meter.

Figure 4B:
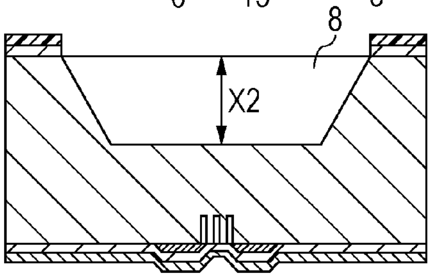

Next, as illustrated in FIG. 4B, anisotropic etching is performed from the first surface of the silicon substrate 1 to form the first liquid supply port 8. This process is the same as the process described with reference to FIG. 2B.

Figure 4C:
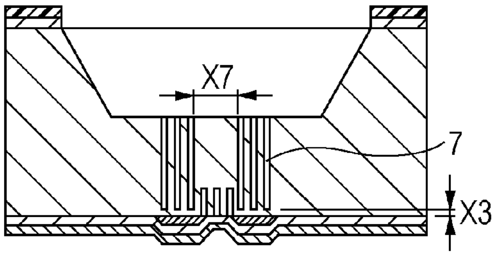

Next, as illustrated in FIG. 4C, a plurality of blind holes 7 extending from the first surface of the silicon substrate toward the second surface which is a surface opposite to the first surface are formed in the silicon substrate. Herein, since the first liquid supply port is formed, the plurality of blind holes extending toward the second surface side are formed from the first surface, i.e., the bottom surface of the liquid supply port. The blind holes 7 are formed in a region where the liquid supply port is to be finally formed. For example, when the silicon substrate is seen from the first surface side, the blind holes 7 are formed in such a manner as to be disposed in the region where the liquid supply port is to be formed. It is suitable that the plurality of blind holes are disposed in the shape of a line, so that a plurality of lines of the blind holes are formed. In this case, when the silicon substrate is seen from the first surface side, it is suitable that the plurality of blind hole lines are substantially symmetrically disposed with respect to the center line along the longitudinal direction of the silicon substrate in the region where the liquid supply port is to be formed. By substantially symmetrically disposing the blind hole lines, the shape of the liquid supply port and the shape of the beam become good.

The length (X3) from the end (end on the second surface side of the blind holes 7) of the blind holes 7 to the second surface of the silicon substrate is suitably set to 10 μm and 75 μm or less. When the end of the blind holes is brought close to the second surface, the liquid supply port can be quickly formed. However, by setting X3 to 10 μm or more, the influence of the blind hole formation on the second surface side can be suppressed. For example, when the blind holes are formed by using a laser and a discharge port formation member is formed on the second surface side, the influence of the heat on the discharge port formation member due to the use of the laser can be suppressed. Moreover, by setting X3 to 75 μm or less, the time taken until the liquid supply port is made to penetrate through the silicon substrate by the following anisotropic etching can be shortened, the size of the beam to be formed in the liquid supply port can be secured, and the substrate strength can be increased.

When the modified regions are formed, the formation position of the blind holes 7 is determined based on the relationship with the modified regions. Specifically, when the silicon substrate is seen from the first surface side, it is suitable that the blind holes 7 are disposed in such a manner as to inwardly surround the modified regions 15 through the silicon substrate.

The blind holes 7 themselves finally serve as a part of the liquid supply port. The silicon in the region sandwiched by the plurality of blind holes when the silicon substrate is seen from the second surface side is partially removed by the anisotropic etching and also serves as a part of the liquid supply port. However, another part of the silicon in the region sandwiched by the plurality of blind holes when the silicon substrate is seen from the second surface side is left without being removed by the anisotropic etching, whereby this part can be used as the beam in the liquid supply port.

In the region where the silicon in the region sandwiched by the plurality of blind holes when the silicon substrate is seen from the second surface side is removed by the anisotropic etching, and then the region from which the silicon has been removed is used as the liquid supply port, the interval of the plurality of blind holes is suitably set to 25 μm or more and 100 μm or less. By setting the interval to 25 μm or more, overlapping of the blind holes with each other can be suppressed when the blind holes are formed. Moreover, by setting the interval to 100 μm or less, the time taken by the following anisotropic etching can be shortened, the size of the beam to be formed in the liquid supply port can be secured, and the substrate strength can be increased.

On the other hand, in the region where the silicon in the region sandwiched by the plurality of blind holes when the silicon substrate is seen from the second surface side is not removed by the anisotropic etching, and the silicon which is left is used as the beam in the liquid supply port, the interval of the plurality of blind holes is suitably set to 120 μm or more and 1000 μm or less. The interval of the blind holes in the region to be used as the beam in the liquid supply port is indicated by X7 in FIG. 4C. By setting X7 to 120 μm or more, the time taken by the following anisotropic etching can be shortened. Furthermore, removal of the portion to serve as the beam by the anisotropic etching can be suppressed, the size of the beam to be formed in the liquid supply port can be secured, and the substrate strength can be increased. Moreover, by setting X7 to 1000 μm or less, the liquid discharge properties of the liquid discharge head can be increased.

Figure 4D:
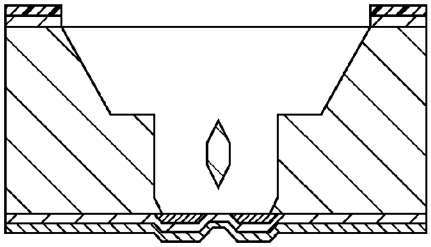
Figure 4E:
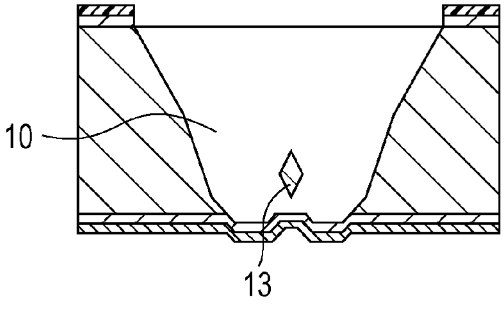

Next, as illustrated in FIG. 4D, the silicon substrate in which the plurality of blind holes are formed is subjected to anisotropic etching from the first surface to form a second liquid supply port 10 in the silicon substrate. This process is the same as the process described with reference to FIG. 2D. However, since the modified regions are formed in FIGS. 4A to 4E, the position where the beam is formed is different from the position described in FIG. 2. More specifically, the beam 13 is formed at a position separated from the second surface of the silicon substrate as illustrated in FIG. 4E. This is because the modified region is etched by the anisotropic etching to be removed.

Thus, even when forming the modified region, the beam can be easily formed in a region on the front surface side (the second surface) of the substrate of the liquid supply port by the processing from the back surface (the first surface) of the silicon substrate. Moreover, in this case, the beam can be formed at a position separated from the second surface of the silicon substrate. When the oxide film 1*a* is formed, the beam can be formed at a position separated from the oxide film 1*a*. When the beam is formed at such a position, it is suitable in the respect of the refilling properties of liquid and the like.

FIG. 5 illustrates an example in which a liquid discharge head is manufactured by a former method different from the method of the present invention to the method for manufacturing a liquid discharge head of the present invention described above.

Figure 5A:
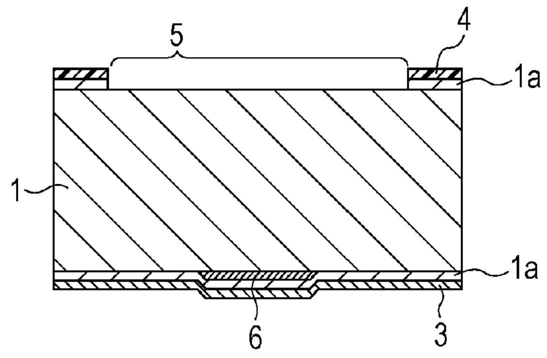
FIG. 5A to FIG. 5C are views illustrating an example of a former method for manufacturing a liquid discharge head.

First, a silicon substrate 1 is prepared as illustrated in FIG. 5A.

Figure 5B:
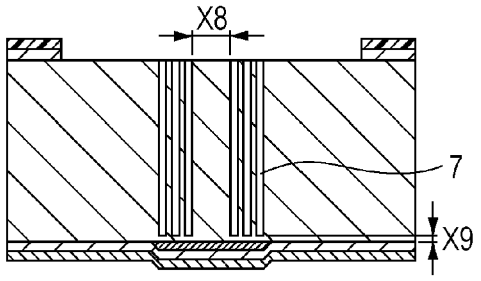

Next, a plurality of blind holes extending from a first surface of the silicon substrate toward a second surface side are formed in the silicon substrate as illustrated in FIG. 5B.

Figure 5C:
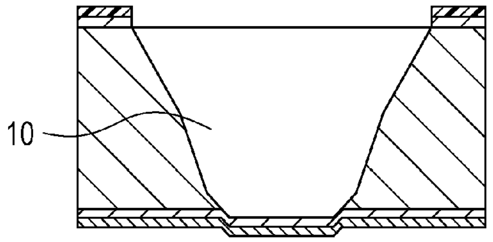

Next, as illustrated in FIG. 5C, a liquid supply port 10 is formed by anisotropic etching. In this case, silicon is not left in the liquid supply port 10 and a beam is not formed. For example, in FIG. 5B, even when the length indicated by X8 is 200 μm, a beam can be prevented from being left by setting X9 to 110 μm.

In the liquid discharge head manufactured by such a method, a beam is not formed on the second surface (front surface) side of the silicon substrate, so that the strength becomes low.

Hereinafter, the present invention is more specifically described with reference to Examples.

Example 1

A liquid discharge head was manufactured by the method illustrated in FIG. 2.

First, as illustrated in FIG. 2A, the silicon substrate 1 which is a (100) substrate was prepared. The thickness of the silicon substrate 1 was 725 μm. As the oxide film 1*a*, $SiO_2$ was used. As the etching mask 4, polyamide was used. The opening portion 5 was formed with a width of 7.5 mm by dry etching. As the sacrificial layer 6, Al—Cu was used. As the passivation layer 3, SiN was used.

The concave portions 14 were formed at positions corresponding to the inside of the opening portion 5 of the silicon substrate by third harmonic generation light of a YAG laser. The diameter of the concave portions 14 was set to 25 μm. The X1 was set to 200 μm. More specifically, the distance from the end (end on the second surface side of the concave portion 14) of the concave portion 14 to the second surface of the silicon substrate was set to 525 μm. The interval of the concave portions 14 was set to 400 μm.

Next, as illustrated in FIG. 2B, anisotropic etching was performed using a 22% by mass TMAH solution from the first surface of the silicon substrate 1 to form the first liquid supply port 8. The temperature of the TMAH solution was set to 80° C. and the etching time was set to 6 hours. The X2 was set to 350 μm. More specifically, the distance from the bottom surface of the first liquid supply port to the second surface of the silicon substrate was set to 375 μm.

Next, as illustrated in FIG. 2C, 116 blind holes 7 extending from the first surface of the silicon substrate toward the second surface which is a surface opposite to the first surface were formed in the silicon substrate by third harmonic generation light of a YAG laser. The plurality of blind holes were disposed in the shape of a line, so that a plurality of lines of the blind holes were formed. When the silicon substrate is seen from the first surface side, the plurality of blind hole lines were substantially symmetrically disposed with respect to the center line along the longitudinal direction of the silicon substrate in the region where the liquid supply port was to be formed. The diameter of the blind holes was set to 25 μm and X3 was set to 25 μm. With respect to the region where the silicon in the region sandwiched by the plurality of blind holes when the silicon substrate was seen from the second surface side was removed by anisotropic etching, and then the portion where the silicon was removed was used as a liquid supply port, the interval of the plurality of blind holes was set to 60 μm. On the other hand, with respect to the region where the silicon in the region sandwiched by the plurality of blind holes when the silicon substrate was seen from the second surface side was left without being removed by anisotropic etching to use the left silicon as a beam, the interval of the plurality of blind holes, i.e., X4, was set to 200 μm.

Next, as illustrated in FIG. 2D, the silicon substrate in which a plurality of blind holes were formed was subjected to anisotropic etching using a 22% by mass solution of TMAH from the first surface. The temperature of the TMAH solution was set to 80° C. and the etching time was set to 2.5 hours. Then, the second liquid supply port 10 was formed in the silicon substrate.

As described above, the liquid discharge head was manufactured. When the cross section of the silicon substrate of the manufactured liquid discharge head was observed under an electron microscope, it was able to be confirmed that a favorable beam was formed in a region on the second surface side of the silicon substrate of the liquid supply port.

Example 2

X4 was set to 120 μm to Example 1. A liquid discharge head was manufactured in the same manner as in Example 1 except for the change. When the cross section of the silicon substrate was observed in the same manner as in Example 1, it was able to be confirmed that a favorable beam was formed in a region on the second surface side of the silicon substrate of the liquid supply port.

Example 3

X4 was set to 1000 μm to Example 1. A liquid discharge head was manufactured in the same manner as in Example 1 except for the change. When the cross section of the silicon substrate was observed in the same manner as in Example 1, it was able to be confirmed that a favorable beam was formed in a region on the second surface side of the silicon substrate of the liquid supply port.

Example 4

X4 was set to 110 μm to Example 1. A liquid discharge head was manufactured in the same manner as in Example 1 except for the change. When the cross section of the silicon substrate was observed in the same manner as in Example 1, it was able to be confirmed that a beam, which was slightly smaller as compared with the beam of Example 1, was formed in a region on the second surface side of the silicon substrate of the liquid supply port.

Example 5

In the stage of FIG. 2A, the discharge port formation member was formed on the second surface side of the silicon substrate to Example 1. The liquid discharge head was manufactured in the same manner as in Example 1 except for the change. When the cross section of the silicon substrate was observed in the same manner as in Example 1, it was able to be confirmed that a favorable beam was formed in a region on the second surface side of the silicon substrate of the liquid supply port.

Example 6

X3 was set to 10 μm to Example 5. A liquid discharge head was manufactured in the same manner as in Example 5 except for the change. When the cross section of the silicon substrate was observed in the same manner as in Example 5, it was able to be confirmed that a favorable beam was formed in a region on the second surface side of the silicon substrate of the liquid supply port.

Example 7

X3 was set to 75 μm to Example 5. A liquid discharge head was manufactured in the same manner as in Example 5 except for the change. When the cross section of the silicon substrate was observed in the same manner as in Example 5, it was able to be confirmed that a favorable beam was formed in a region on the second surface side of the silicon substrate of the liquid supply port.

Example 8

X3 was set to 5 μm to Example 5. A liquid discharge head was manufactured in the same manner as in Example 5 except for the change. When the cross section of the silicon substrate was observed in the same manner as in Example 5, it was able to be confirmed that a favorable beam was formed in a region on the second surface side of the silicon substrate of the liquid supply port. However, when the discharge port formation member was observed under an electron microscope, there was a slightly deformed portion as compared with the discharge port formation member of Example 1.

Example 9

X3 was set to 80 μm to Example 5. Furthermore, the anisotropic etching in FIG. 2D was performed in 2.8 hours. A liquid discharge head was manufactured in the same manner as in Example 5 except for the changes. When the cross section of the silicon substrate was observed in the same manner as in Example 5, it was able to be confirmed that a beam, which was slightly smaller as compared with the beam of Example 5, was formed in a region on the second surface side of the silicon substrate of the liquid supply port.

Example 10

A liquid discharge head was manufactured by the method illustrated in FIGS. 3A to 3D. The members and the processing methods are basically the same as those of Example 1. However, as illustrated in FIGS. 3A to 3D, when the silicon substrate was seen from the second surface side, the sacrificial layer was not formed at a position which overlaps with the center line along the longitudinal direction of the silicon substrate in a region where the liquid supply port was to be formed. Moreover, as illustrated in FIG. 3A, the concave portion 14 was not formed. A liquid discharge head was manufactured in the same manner as in Example 1 except for the changes. When the cross section of the silicon substrate was observed in the same manner as in Example 1, it was able to be confirmed that a favorable beam was formed in a region on the second surface side of the silicon substrate of the liquid supply port. Moreover, unlike Example 1, the beam was formed at a position in contact with the oxide film 1*a* of the silicon substrate.

Example 11

A liquid discharge head was manufactured by the method illustrated in FIGS. 4A to 4E.

First, as illustrated in FIG. 4A, the silicon substrate 1 which is a (100) substrate was prepared. The thickness of the silicon substrate 1 was 725 μm. As the oxide film 1*a*, $SiO_2$ was used. As the etching mask 4, polyamide was used. The opening portion 5 was formed with a width of 7.5 mm by dry etching. As the sacrificial layer 6, Al—Cu was used. As the passivation layer 3, SiN was used.

The concave portions 14 were formed at positions corresponding to the inside of the opening portion 5 of the silicon substrate by third harmonic generation light of a YAG laser. The diameter of the concave portions 14 was set to 25 μm. The X1 was set to 200 μm. More specifically, the distance from the end (end on the second surface side of the concave portion 14) of the concave portion 14 to the second surface of the silicon substrate was set to 525 μm. The interval of the concave portions 14 was set to 400 μm.

Next, the modified silicon region 15 was formed on the second surface side of the silicon substrate. The modified region was formed by a method including, using fundamental wave of a YAG laser, adjusting the laser focus into the silicon substrate, and then performing multiphoton absorption laser processing. Moreover, the sacrificial layer and the modified region were prevented from overlapping with each other when the silicon substrate was seen from the second surface side, and a plurality of lines of the modified regions were formed along with the longitudinal direction of the silicon substrate. X5 was set to 200 μm. X6 was set to 50 μm.

Next, as illustrated in FIG. 4B, anisotropic etching was performed from the first surface of the silicon substrate 1 to form the first liquid supply port 8. This process was the same as that described with reference to FIG. 2B of Example 1.

Next, as illustrated in FIG. 4C, a plurality of blind holes 7 extending from the first surface of the silicon substrate toward the second surface which is a surface opposite to the first surface were formed in the silicon substrate. This process was also basically the same as that described with reference to FIG. 2C of Example 1. However, when the silicon substrate was seen from the first surface side, the blind holes 7 were disposed in such a manner as to inwardly surround the modified regions 15 through the silicon substrate. X7 was set to 200 μm.

Next, as illustrated in FIG. 4D, the silicon substrate in which a plurality of blind holes were formed was subjected to anisotropic etching using a TMAH solution from the first surface to form the second liquid supply port 10 in the silicon substrate. The temperature of the TMAH solution was set to 80° C. The etching time was set to 2 hours.

As described above, a liquid discharge head was manufactured. When the cross section of the silicon substrate was observed in the same manner as in Example 1, it was able to be confirmed that a favorable beam was formed in a region on the second surface side of the silicon substrate of the liquid supply port. Unlike Example 1, the beam was able to be formed at a position separated from the oxide film 1*a* of the silicon substrate.

Comparative Example 1

A liquid discharge head was manufactured by the method illustrated in FIGS. 5A to 5C.

First, the silicon substrate 1 as illustrated in FIG. 5A was prepared. Herein, the process is the same as that of Example 1, except not forming the concave portion 14.

Next, as illustrated in FIG. 5B, a plurality of blind holes extending from the first surface of the silicon substrate toward the second surface side were formed in the silicon substrate by third harmonic generation light of a YAG laser. Herein, the X8 was set to 200 μm. The X9 was set to 110 μm.

Next, as illustrated in FIG. 5C, the silicon substrate in which a plurality of blind holes were formed was subjected to anisotropic etching using a 22% by mass TMAH solution from the first surface to form the second liquid supply port 10 in the silicon substrate. The temperature of the TMAH solution was set to 80° C. The etching time was set to 6 hours.

As described above, a liquid discharge head was manufactured. When the cross section of the silicon substrate was observed in the same manner as in Example 1, a beam was not able to be confirmed in a region on the second surface side of the silicon substrate of the liquid supply port.

According to the present invention, the beam can be easily formed in a region on the front surface side of the substrate of the liquid supply port by processing from the back surface side of the substrate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-044068, filed Mar. 6, 2013 which is hereby incorporated by reference herein in its entirety.

What is claimed is:

1. A method for manufacturing a liquid discharge head having a silicon substrate in which a beam is formed in a liquid supply port, the method comprising:

forming a first liquid supply port in a silicon substrate;

forming a plurality of blind holes extending from a first surface of the silicon substrate toward a side of a second surface which is a surface opposite to the first surface in the silicon substrate from a bottom surface of the first liquid supply port; and subjecting the silicon substrate in which the plurality of blind holes are formed to anisotropic etching from the first surface to form a second liquid supply port in the silicon substrate, the first liquid supply port and the second liquid supply port constituting at least one part of the liquid supply port, and in the formation of the second liquid supply port in the silicon substrate, the silicon in a region sandwiched by the plurality of blind holes when the silicon substrate is seen from the second surface side being left without being removed by the anisotropic etching in order to use the silicon left in the region sandwiched by the plurality of blind holes as a beam.

2. The method for manufacturing a liquid discharge head according to claim 1, wherein an interval of the plurality of blind holes is set to 120 μm or more and 1000 μm or less in the region where the silicon is not removed by the anisotropic etching.

3. The method for manufacturing a liquid discharge head according to claim 1, wherein a length from an end of the blind hole to the second surface of the silicon substrate is 10 μm or more and 75 μm or less.

4. The method for manufacturing a liquid discharge head according to claim 1, wherein the silicon in the region sandwiched by the plurality of blind holes is partially removed by the anisotropic etching to form a liquid supply port, and, in the region, an interval of the plurality of blind holes is set to 25 μm or more and 100 μm or less.

5. The method for manufacturing a liquid discharge head according to claim 1, wherein a plurality of lines of the blind holes are formed by the plurality of blind holes.

6. The method for manufacturing a liquid discharge head according to claim 5, wherein when the silicon substrate is seen from the first surface side, the plurality of blind hole lines are symmetrically disposed with respect to a center line along a longitudinal direction of the silicon substrate in the region where the liquid supply port is to be formed.

7. The method for manufacturing a liquid discharge head according to claim 1, wherein when performing the anisotropic etching, a sacrificial layer is formed on the second surface side of the silicon substrate.

8. The method for manufacturing a liquid discharge head according to claim 7, wherein when the silicon substrate is seen from the second surface side, the sacrificial layer is not formed at a position which overlaps with the center line along the longitudinal direction of the silicon substrate in the region where the liquid supply port is to be formed.

9. The method for manufacturing a liquid discharge head according to claim 1, wherein when performing the anisotropic etching, a modified silicon region is formed on the second surface side of the silicon substrate.

10. The method for manufacturing a liquid discharge head according to claim 9, wherein a width in a lateral direction of the silicon substrate of the modified region is 120 μm or more and 1000 μm or less.

11. The method for manufacturing a liquid discharge head according to claim 9, wherein a depth from the second surface of the modified region is 2 μm or more and 120 μm or less.

* * * * *